United States Patent
Wernicki

(10) Patent No.: US 8,161,335 B2
(45) Date of Patent: Apr. 17, 2012

(54) SYSTEM AND METHOD FOR TESTING A CIRCUIT

(75) Inventor: Michael W. Wernicki, Jersey City, NJ (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 280 days.

(21) Appl. No.: 12/387,626

(22) Filed: May 5, 2009

(65) Prior Publication Data
US 2010/0287428 A1 Nov. 11, 2010

(51) Int. Cl.
*G01R 31/28* (2006.01)
(52) U.S. Cl. .................. 714/724; 714/725
(58) Field of Classification Search .......... 714/724, 714/725, 726, 799, 703, 742, 733, 734, 30
See application file for complete search history.

(56) References Cited

U.S. PATENT DOCUMENTS

| | | | | |
|---|---|---|---|---|
| 4,703,483 A | * | 10/1987 | Enomoto et al. | 714/735 |
| 5,270,641 A | * | 12/1993 | Van Loan et al. | 324/754.11 |
| 5,794,007 A | * | 8/1998 | Arrigotti et al. | 716/117 |
| 6,094,624 A | * | 7/2000 | Chao | 702/117 |
| 7,117,416 B1 | * | 10/2006 | Fox | 714/733 |
| 7,279,887 B1 | * | 10/2007 | King et al. | 324/756.02 |
| 7,363,558 B2 | * | 4/2008 | Fukuyama | 714/724 |
| 7,528,623 B2 | * | 5/2009 | Zellner et al. | 324/760.01 |
| 2008/0001618 A1 | * | 1/2008 | King et al. | 324/765 |

* cited by examiner

*Primary Examiner* — Phung M Chung
(74) *Attorney, Agent, or Firm* — Dilworth & Barrese, LLP; Leo G. Lenna

(57) ABSTRACT

A system for testing a circuit. The system comprises a first circuit mounted on an embedded first circuit board and a test circuit mounted on the embedded first circuit board. The system further comprises a second circuit board on the first circuit board, the second circuit board including a second circuit and a test device external to the first and second circuit board. The test circuit is effective to send at least one first test signal from the test circuit to the first circuit, receive a first response of the at least one first test signal from the first circuit, and forward the first response to the test device.

18 Claims, 5 Drawing Sheets

SYSTEM AND METHOD FOR TESTING A CIRCUIT

BACKGROUND OF THE INVENTION

1. Field of the Invention

This disclosure relates to a system and method for testing a circuit and, more particularly, to a system and method including a testing circuit mounted on the same circuit board as a circuit to be tested.

2. Description of the Related Art

An example of a prior art circuit testing approach is shown in FIG. 1. As shown, a circuit 20 mounted on a circuit board 22 can be tested by sending test signals in the form of a current or voltage to traces 24 of circuit 20. Received responses can be used to evaluate an operation of circuit 20. In order to send the test signals and receive responses, a probe 26 including leads 28 may be used. Designers of circuit 20 try to make circuit 20 and traces 24 as small as possible. As a consequence, leads 28 of probe 26 may be too big to be able to contact an individual terminal 24. To allow leads 28 to communicate with terminals 24, pads 30 may be added to terminals 24 to facilitate engagement and communication of leads 28. As can be discerned, pads 28 take up a significant amount of space in circuit board 22 which detracts from the goal of trying to make circuit 20 as small as possible. The disclosure describes an improvement upon such approaches.

SUMMARY OF THE INVENTION

One embodiment of the invention is a system for testing a circuit. The system comprises a first circuit mounted on an embedded first circuit board and a test circuit mounted on the embedded first circuit board. The system further comprises a second circuit board on the first circuit board, the second circuit board including a second circuit and a test device external to the first and second circuit board. The test circuit is effective to send at least one first test signal from the test circuit to the first circuit; receive a first response of the at least one first test signal from the first circuit; and forward the first response to the test device.

Another embodiment of the invention is a method for testing a circuit. The method comprises mounting a first circuit on a first circuit board, mounting a test circuit on the first circuit board, and sending at least one first test signal from the test circuit to the first circuit. The method further comprises receiving a first response of the at least one first test signal from the first circuit at the test circuit; and forwarding the first response to a test device external to the first circuit board.

Yet another embodiment of the invention is an electronic device. The electronic device comprises a first circuit mounted on an embedded first circuit board; a test circuit mounted on the embedded first circuit board; and a second circuit board on the first circuit board.

BRIEF DESCRIPTION OF THE DRAWINGS

The drawings constitute a part of the specification and include exemplary embodiments of the present invention and illustrate various objects and features thereof.

DETAILED DESCRIPTION OF THE PREFERRED EMBODIMENT(S)

Figure 1:
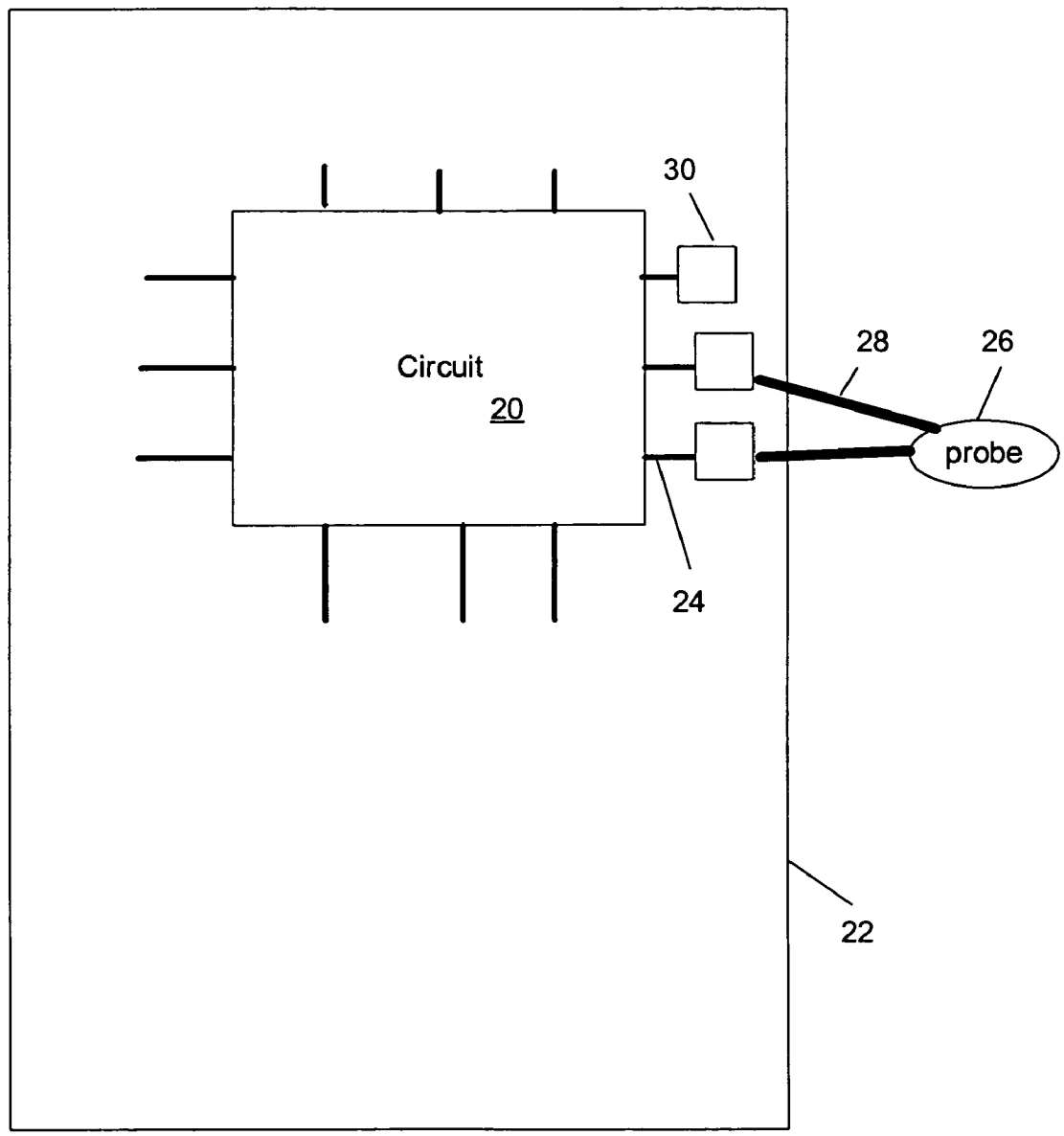
FIG. 1 is a circuit drawing of circuit and testing device in accordance with the prior art.

Various embodiments of the invention are described hereinafter with reference to the figures. Elements of like structures or function are represented with like reference numerals throughout the figures. The figures are only intended to facilitate the description of the invention or as a on the scope of the invention. In addition, an aspect described in conjunction with a particular embodiment of the invention is not necessarily limited to that embodiment and can be practiced in conjunction with any other embodiments of the invention.

The inventor has discovered that recent advances in electronic device design involve circuit boards being placed over other circuit boards. Circuit components are mounted on a first circuit board. That first circuit board is then enclosed or embedded by filling voids in the first circuit board with an epoxy and a second circuit board with additional circuit components mounted thereon is placed on the first circuit board. Components on the first circuit board, once embedded, cannot thereafter be replaced. It is important to be able to test components on the first circuit board before embedding. Yields on untested boards are poor and a circuit board cannot be repaired after it is embedded. The poor yield of an untested embedded circuit board results in an unacceptable yield of the more expensive finished multi-layered electronic device.

Moreover, the inventor realized that prior art circuit testing devices are unable to test components at full operating speed. Consequently, these prior art testing devices cannot detect various faults. In fact, some components may not function at all when operated below a minimum specified operating frequency. As discussed above, the addition of pads may be required to allow for communication by test probes in prior art test systems. Those pads take up valuable board space, and yield unwanted capacitance and inductance which may cause the circuit being tested to operate incorrectly. The probes themselves also yield undesired capacitance. Still further, prior art testing devices cannot handle the skew and timing requirements of testing complex time critical circuitry.

Figure 2:
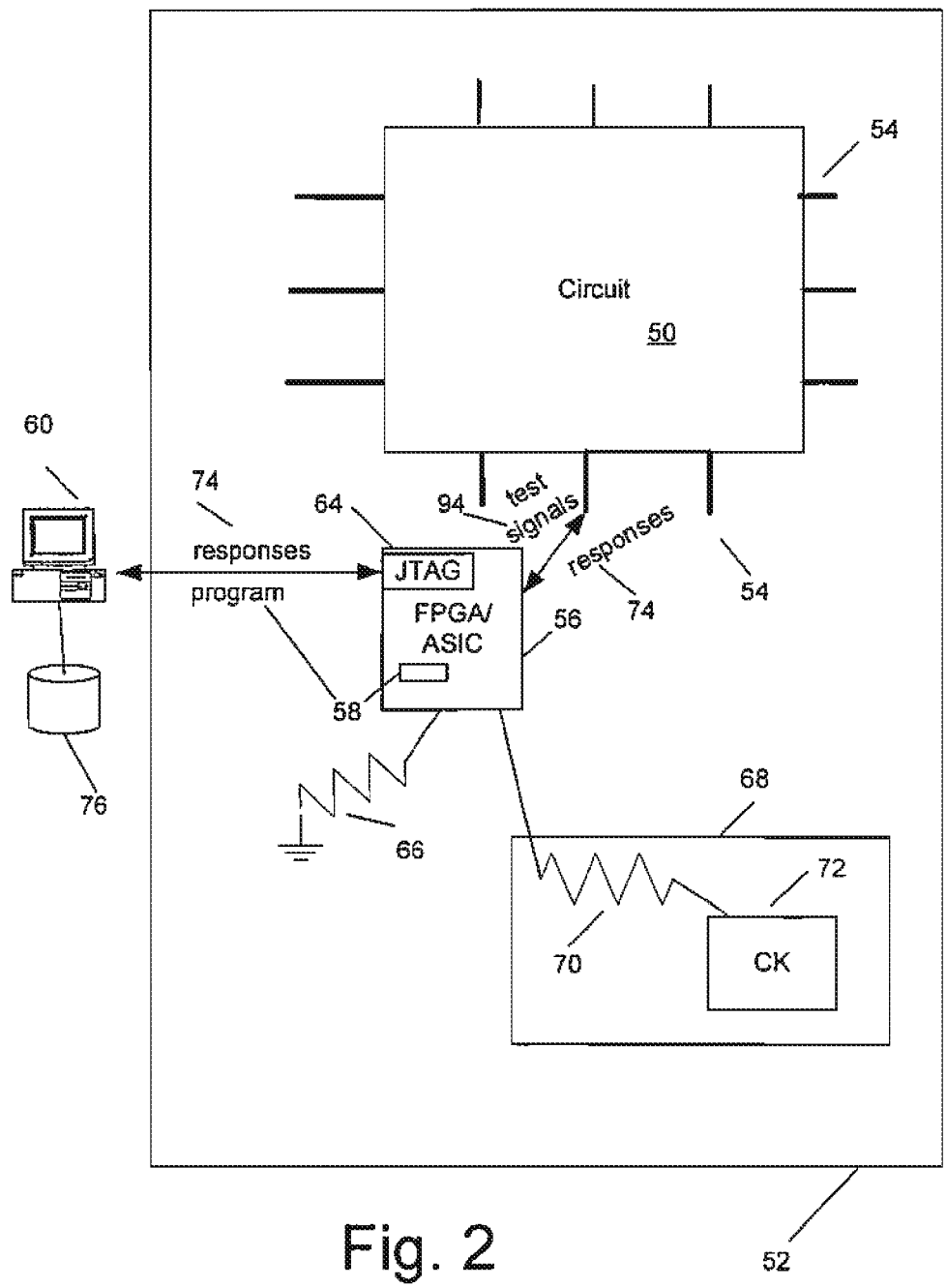
FIG. 2 is a circuit drawing of a system for testing a circuit in accordance with an embodiment of the invention.

Referring to FIG. 2, there is shown a system for testing a circuit in accordance with embodiment of the invention. A circuit 50 including traces 54 is mounted on a circuit board 52 and may be tested using a test circuit 56. Test circuit 56 is mounted on circuit board 52 and communicates with traces 54 through test signals 94. Test circuit 56 may be implemented as, for example, a FPGA (field programmable gate array), ASIC (application specific integrated circuit), gate array, standard cell, (PAL) programmable array logic, CPLD (complex programmable logic device), discrete logic device, etc. Test circuit 56 includes a program 58 to control testing of circuit 50 by generating test signals 94. Program 58 may be updated from a test device 60 in consultation with a database 76 through, for example, a JTAG (Joint Test Action Group i.e. in accordance with the IEEE 1149.1 standard) interface 64. By mounting test circuit 56 on circuit board 52, test circuit 56 may perform tests on circuit 50 at full operating speeds while JTAG interface 64 allows test circuit 56 to provide responses 70 to those tests to testing device 60 external to circuit board 52 using a standard form of communication. Responses 74 can be communicated using a relatively slow speed JTAG interface 64 operating at, for example, 1 to 30 MHz while circuit 50 may be tested using test signals 94 at frequencies greater than 150 MHz.

As can be seen in FIG. 2, the distance between test circuit 56 and circuit 50 is much shorter than that available in prior art testing systems. As test circuit 56 is mounted on circuit board 52, parasitic capacitance and inductance are minimized and skew in sending and receiving signals is significantly reduced. Some logic circuitry in circuit 50 may require signal skew or relative signal lag of 50 ps or less. Such stringent skew requirements can be handled by implementing test circuit 56. Test circuit 56 may be used to test an integrated circuit chip 50, a circuit comprising a discrete component such as a resistor 66 or a complex circuit 68 including both a discrete component 70 and integrated circuit chip 72.

Figure 3:
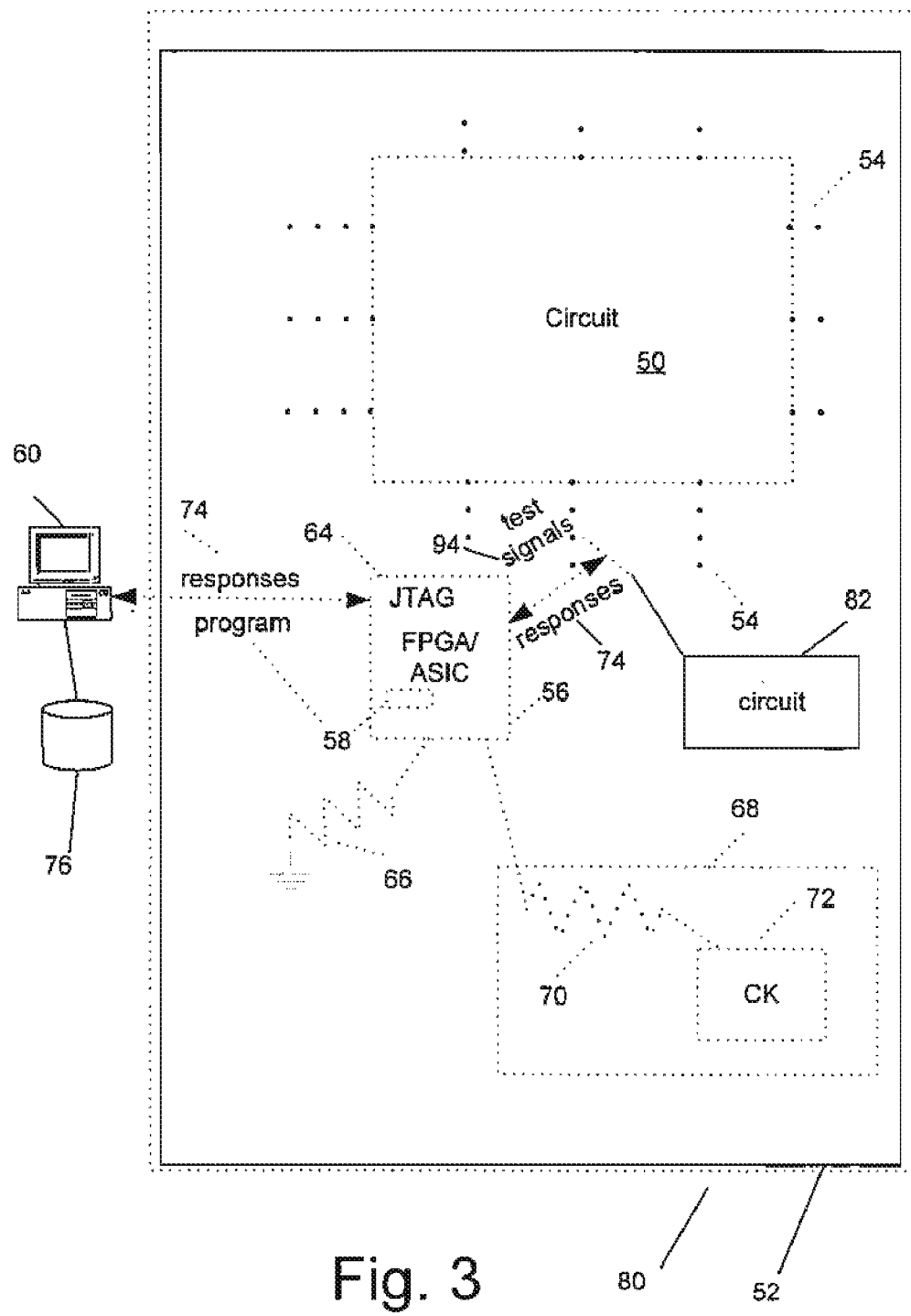
FIG. 3 is a circuit drawing of a system for testing a circuit in accordance with an embodiment of the invention.

Further, as test circuit 56 is mounted on circuit board 52, test circuit 56 may remain on circuit board 52 while circuit board 52 is embedded, for example, by having voids filled with an epoxy like G10, and a second circuit board 80 is placed over first circuit board 52 as shown in FIG. 3. In FIG. 3, first circuit board 52 and components mounted thereon are shown in dotted lines. Second circuit board 80 may include additional circuits, including integrated circuit chips 82 mounted thereon. As first circuit board 50 is now generally inaccessible except for its terminals, it is desirable to have a high confidence that circuits mounted on circuit board 50 work correctly. Once circuits are embedded, they generally cannot be replaced if there are problems. Test circuit 56 can provide that confidence.

Test circuit 56 can also test communication between circuits on different circuit boards. For example, circuit 82 on circuit board 80 may be wired to communicate with circuit 50 on circuit board 52. As shown, test circuit 56 may be used to test these communications and provide responses 74 of those tests. Program 58 of test circuit 56 may be modified by test device 60 based on the addition of circuit board 80. For example, in testing circuit 50 on circuit board 52, program 58 may control test circuit 56 to drive test signals 94 into circuit 50 and to read responses 74. Such driving signals may be used to simulate signals produced by circuit 82 before circuit 82 is added. Once circuit board 80 and circuit 82 are added, program 58 may be modified by test device 60 so that test signals 94 are requests for responses 74 of circuit 50 driven by signals from circuit 82. Circuit 50 may be used to monitor a health status of an electronic device including circuit board 50 and circuit board 82. Such complex and robust circuit testing is not available in the prior art. More than one program 58 may be used in parallel or in sequence to test different characteristics of components in circuit boards 52, 80.

Figure 4:
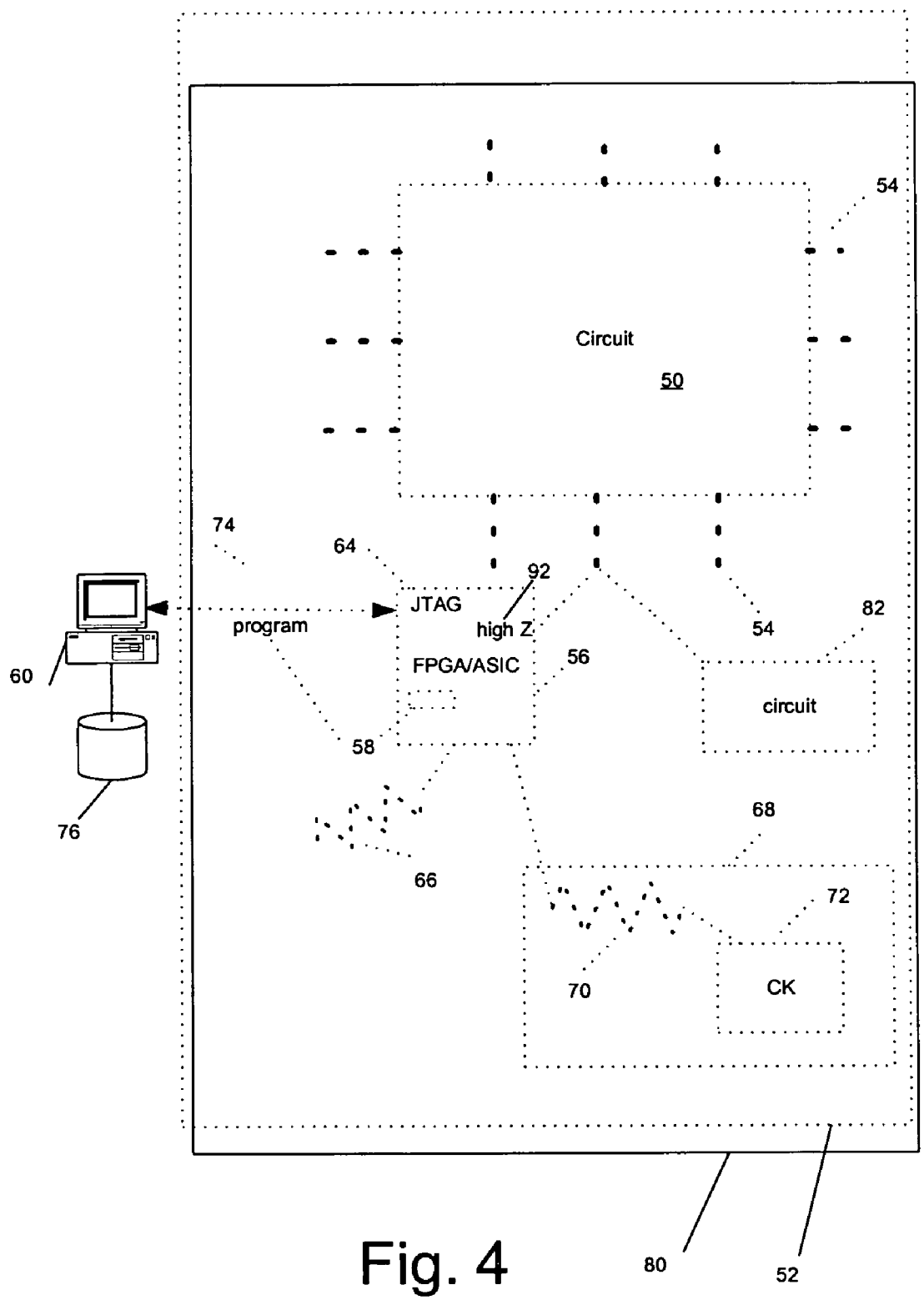
FIG. 4 is a circuit drawing of a system for testing a circuit in accordance with an embodiment of the invention.

Referring to FIG. 4, when a multi-layered electronic device 90, including circuit board 52 and circuit board 80, is complete, test circuit 56 is no longer needed. Outputs of test circuit 56 are tri-stated so that test circuit 56 may effectively be prevented from communicating with other circuit elements in multi-layered electronic device 90. For example, program 58 may cause the outputs of test circuit 56 to have a high impedance, (e.g., over 0.5M ohms) such as through the use of de-coupling capacitors, as shown at 92. Such a high impedance 92 would effectively remove test circuit 56 from multi-layered electronic device 90. This allows multi-layered electronic device 90 to operate normally without fear that test circuit 56 may interfere with an operation of multi-layered electronic device 90.

Figure 5:
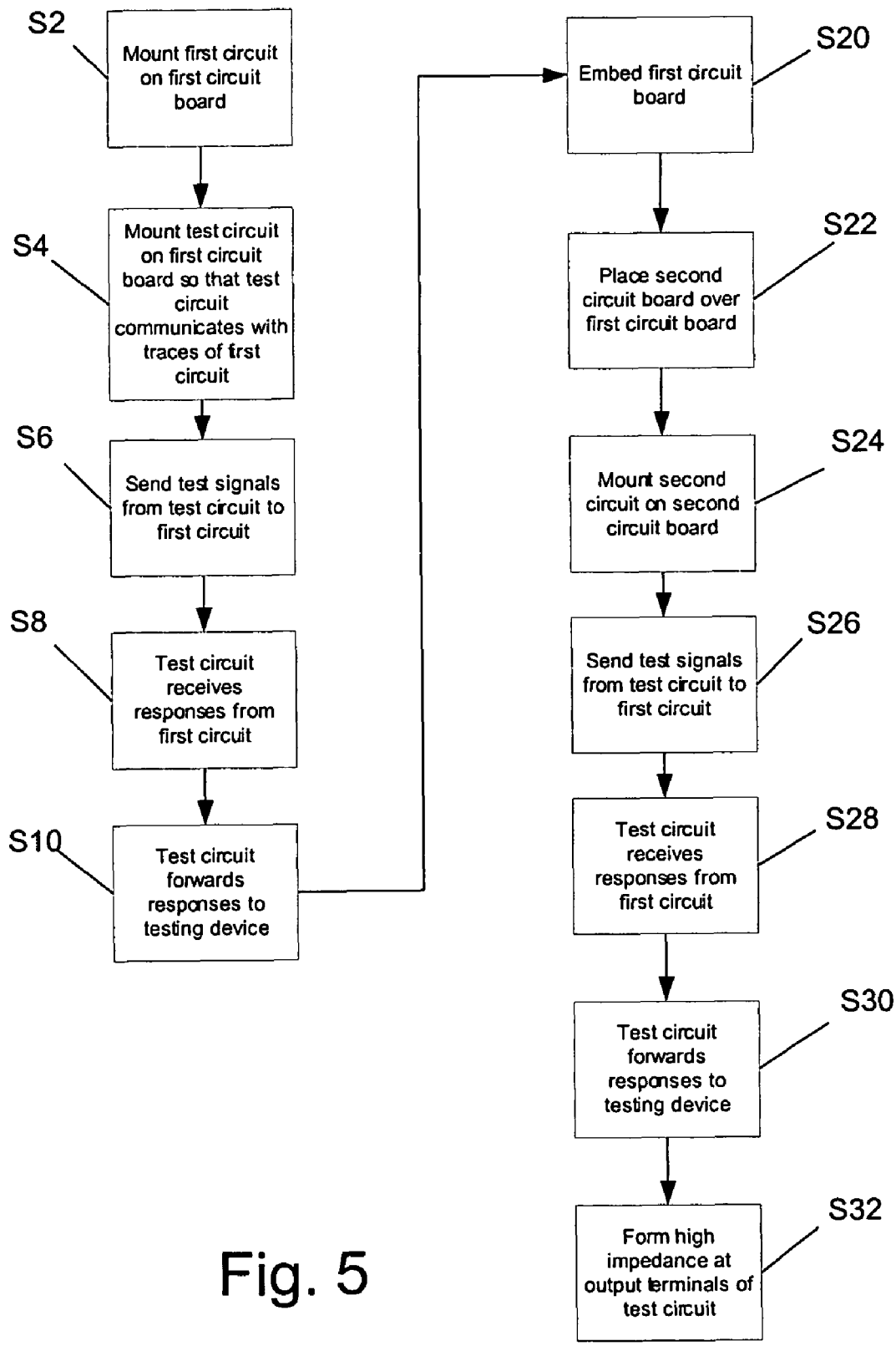
FIG. 5 is a flow chart of a process for testing a circuit in accordance with an embodiment of the invention.

Referring to FIG. 5, there is shown a flow chart of a process for testing a circuit in accordance with an embodiment of the invention. The process of FIG. 5 could be implemented using, for example, test circuit 56 described above. As shown, at step S2, a first circuit to be tested is mounted on a first circuit board. At step S4, a test circuit is mounted on the first circuit board so that the test circuit communicates with traces of the first circuit. At step S6, the test circuit sends test signals to the first circuit. At step S8, the test circuit receives responses from the first circuit. At step S10, the test circuit forwards the responses to a testing device external to the first circuit board.

Once the first circuit and other elements on the first circuit board are tested, the first circuit board may be embedded at step S20. At step S22, a second circuit board is placed over the first circuit board. At step S24, a second circuit is mounted on the second circuit board, so that the second circuit communicates with the first circuit. At step S26, test signals are sent from the test circuit to the first circuit. Such test signals may include a request to receive responses from the first circuit and not necessarily signals intended to drive the first circuit. At step S28, the test circuit receives responses from the first circuit. At step S30, the test circuit forwards the responses to a testing device external to the first and second circuit board. Once the first circuit and its interaction with the second circuit are tested, the testing circuit may be removed from a resultant multi-layered electronic device by forming a high impedance at the output terminals of the test circuit at step S32.

Thus, test circuit 56 provides improved yield of multi-layered electronic devices 90. Circuits in multi-layered electronic device 90 may be tested at full operating speed—such testing was not available in the prior art. Test circuit 56 may be removed from communication with circuit elements in multi-layered electronic device 90 so that multi-layered electronic device 90 can operate without interference. Responses 74 may be provided to a user at a standard test device 60 for review using a slower interface. Moreover, communication between circuits on different circuit boards in multiple layers of multi-layered electronic device 90 may be tested.

While the invention has been described with reference to a number of exemplary embodiments, it will be understood by those skilled in the art that various changes can be made and equivalents can be substituted for elements thereof without departing from the scope of the invention. In addition, many modifications can be made to adapt a particular situation or material to the teachings of the invention without departing from essential scope thereof. Therefore, it is intended that the invention not be limited to any particular exemplary embodiment disclosed herein.

What is claimed is:

1. A system for testing a circuit, the system comprising:
   a first circuit mounted on an upper surface of an embedded first circuit board;
   a test circuit mounted on the upper surface of the embedded first circuit board;
   a second circuit board attached to the embedded first circuit board adjacent to the upper surface, the second circuit board including a second circuit in communication with the first circuit; and
   a test device external to the first and second circuit board;
   wherein the test circuit is effective to
      send at least one first test signal from the test circuit to the first circuit;
      receive a first response of the at least one first test signal from the first circuit; and
      forward the first response to the test device.

2. The system as recited in claim 1, wherein the first test signal is at a frequency greater than 150 MHz.

3. The system as recited in claim 1, wherein the test circuit is further effective to cause a terminal of the test circuit to have an impedance of at least 0.5M Ohm.

4. The system as recited in claim 1, wherein the test circuit forwards the first response through a JTAG interface.

5. The system as recited in claim 1, wherein the test circuit is a FPGA.

6. The system as recited in claim 1, wherein the test circuit is an ASIC.

7. The system as recited in claim 1, wherein the first test signal drives the first circuit.

8. The system as recited in claim 1, wherein the first test signal is a request for a response from the first circuit.

9. An electronic device comprising:
   a first circuit mounted on an upper surface of an embedded first circuit board;
   a test circuit in communication with the first circuit and mounted on the upper surface of the embedded first circuit board; and
   a second circuit board including a second circuit in communication with the first circuit and attached to the embedded first circuit board adjacent to the upper surface.

10. The method as recited in claim 9, wherein the first test signal is at a frequency greater than 150 MHz.

11. The method as recited in claim 9, wherein the first test signal drives the first circuit.

12. The method as recited in claim 9, further comprising:
    attaching a second circuit board to the first circuit board adjacent to the upper surface;
    mounting a second circuit on the second circuit board, the second circuit in communication with the first circuit;
    sending at least one second test signal from the test circuit to the first circuit;
    receiving a second response of the least one second test signal from the first circuit at the test circuit; and
    forwarding the second response to the test device.

13. The method as recited in claim 12, wherein the second test signal is a request for a response from the first circuit.

14. The method as recited in claim 12, further comprising causing a terminal of the test circuit to have an impedance of at least 0.5M Ohm.

15. The method as recited in claim 12, wherein the test circuit forwards the first and second response through a JTAG interface.

16. The method as recited in claim 9, wherein the test circuit is a FPGA.

17. The method as recited in claim 9, wherein the test circuit is an ASIC.

18. An electronic device comprising:
    a first circuit mounted on an upper surface of an embedded first circuit board;
    a test circuit mounted on the upper surface of the embedded first circuit board; and
    a second circuit board including a second circuit in communication with the first circuit and attached to the embedded first circuit board adjacent to the upper surface.

* * * * *